(12) United States Patent  
Taylor

(10) Patent No.: US 6,750,144 B2
(45) Date of Patent: Jun. 15, 2004

(54) METHOD FOR ELECTROCHEMICAL METALLIZATION AND PLANARIZATION OF SEMICONDUCTOR SUBSTRATES HAVING FEATURES OF DIFFERENT SIZES

(75) Inventor: E. Jennings Taylor, Troy, OH (US)

(73) Assignee: Faraday Technology Marketing Group, LLC, Troy, OH (US)

( * ) Notice: Subject to any disclaimer, the term of this patent is extended or adjusted under 35 U.S.C. 154(b) by 0 days.

(21) Appl. No.: 10/367,600
(22) Filed: Feb. 14, 2003
(65) Prior Publication Data
US 2003/0178315 A1 Sep. 25, 2003

Related U.S. Application Data
(60) Provisional application No. 60/356,741, filed on Feb. 15, 2002.

(51) Int. Cl.$^7$ ............................................. H01L 21/44
(52) U.S. Cl. ...................... 438/678; 438/697; 205/101; 205/103
(58) Field of Search .................... 205/50, 80, 101–108, 205/118, 123, 244–252, 283, 292, 86; 438/672–678, 620, 631, 633, 646, 697

(56) References Cited

U.S. PATENT DOCUMENTS 5,486,280 A  *  1/1996  Bullock, IV et al. ......... 205/67
5,720,866 A  *  2/1998  Erokhine et al. ............. 205/83
5,972,192 A  * 10/1999  Dubin et al. ................ 205/101
6,221,235 B1    4/2001  Gebhart
6,402,931 B1    6/2002  Zhou et al.
6,558,231 B1    5/2003  Taylor

* cited by examiner

Primary Examiner—Caridad Everhart
Assistant Examiner—Calvin Lee
(74) Attorney, Agent, or Firm—Thompson Hine LLP

(57) ABSTRACT

A method for filling recesses of different sizes on a semiconductor substrate comprising immersing a semiconductor substrate having a surface provided with recesses of different sizes in an electroplating bath containing ions of a metal to be deposited on the surface; immersing a counter electrode in the plating bath; passing an electric current between the substrate and the counterelectrode; wherein, in a first electroplating step, the electric current is a modulated reversing electric current comprising a train of pulses that are cathodic with respect to the substrate and pulses that are anodic with respect to the substrate, whereby the pulse train in the first step has a first period, the cathodic pulses have an on-time of from about 0.83 microseconds to about 50 milliseconds and the anodic pulses have an on-time of from about 42 microseconds to about 99 milliseconds, the cathodic and anodic pulses have a charge transfer ratio of the cathodic pulses to the anodic pulses that is greater than one; in a second electroplating step, the electric current is a, modulated reversing electric current comprising a train of pulses that are cathodic with respect to the substrate.

18 Claims, 2 Drawing Sheets

METHOD FOR ELECTROCHEMICAL METALLIZATION AND PLANARIZATION OF SEMICONDUCTOR SUBSTRATES HAVING FEATURES OF DIFFERENT SIZES

This application claims the benefit of provisional No. 60/356,741 filed on Feb. 15, 2002.

BACKGROUND OF THE INVENTION

1. Field of the Invention

This invention relates to metallization of semiconductor substrates and more particularly to metallization of semiconductor substrates having surface recesses of different sizes.

2. Brief Description of the Prior Art

In order to interconnect the transistors and associated devices on semiconductor wafers in the manufacture of integrated circuits, it is conventional to etch trenches, vias, and the like, into the surface of the silicon substrate, or into one or more layers of insulating material deposited thereon, and to deposit metal into these recessed structures. As the density of devices on the semiconductor chip has increased and the individual devices have become smaller, the connecting traces also have become smaller. In the manufacture of very large scale integrated (VLSI) chips and ultra large scale integrated (ULSI) chips, highly conductive metals, e.g., copper, have come to be used for the conductive traces, and attempts have been made to deposit the copper in these traces by electrochemical methods. The electroplating of copper traces on the surface of semiconductor wafers using pulse reverse electrodeposition is discussed in U.S. Pat. Nos. 6,203,684 and 6,319,384, the entire disclosures of which is incorporated herein by reference.

However, it has been found that when the features, i.e., trenches, vias, and the like, formed on the surface of a semiconductor wafer are of different sizes, complete filling of all the features on a wafer is difficult to achieve, even when pulse reverse electroplating is used.

Accordingly, a need has continued to exist for a method of filling recesses of all sizes on the surface of a semiconductor wafer using an electrochemical deposition process.

SUMMARY OF THE INVENTION

The problem of filling features of different sizes on the surface of a semiconductor wafer has now been alleviated by the method of the invention using modulated electric fields, i.e., pulse reverse current, wherein features in each size range are filled using a pulse waveform adapted to preferentially fill the selected size. Typically the smaller features are filled first and the larger ones are filled in one or more subsequent steps. It is also according to the invention to incorporate one or more electroetching steps into the process in order to avoid excessive overplating of metal onto the surface of the wafer.

Accordingly, it is an object of the invention to provide a method for electroplating a metal, e.g., copper, onto the surface of a semiconductor having recesses of different sizes therein.

A further object is to provide a method for metallizing the surface of an etched semiconductor wafer without excessive overplate.

Further objects of the invention will be apparent from the description of the invention which follows.

DETAILED DESCRIPTION OF THE INVENTION AND PREFERRED EMBODIMENTS

Figure 1:
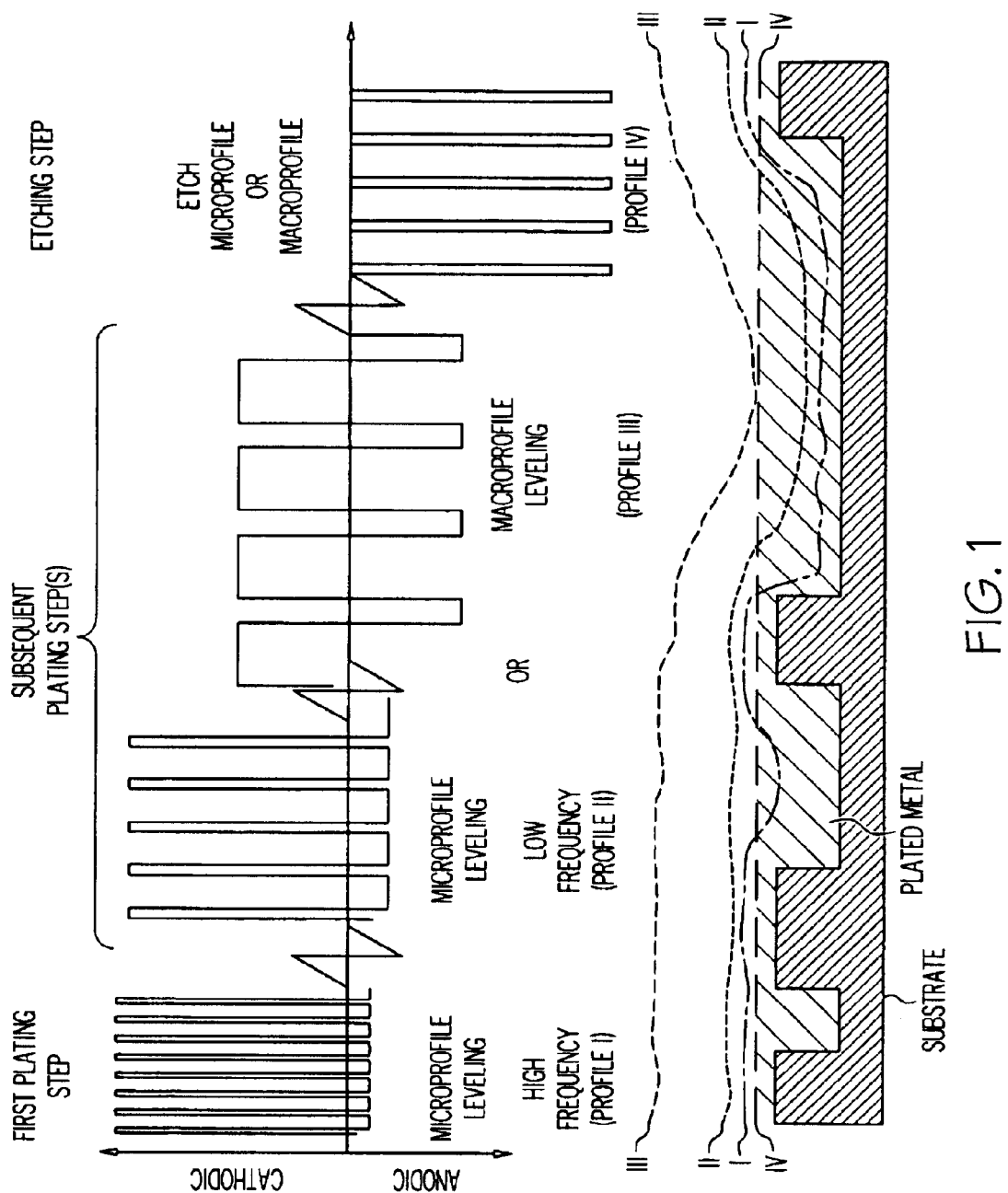
FIG. 1 is a schematic illustration of the method of the invention showing exemplary waveforms (Profiles I–IV) used for each step of the process and the thickness of the plating produced thereby.

According to the invention, the waveform used to deposit metal into the recesses in the surface of a semiconductor is adapted to the size of the feature as indicated by the smallest transverse dimension of the recess. A semiconductor wafer having recesses with small transverse dimensions, typically 10 micrometers or less. The largest of these features may either represent a macrorough or microrough surface, depending of the agitation of the plating bath, or the rotation rate of the semiconductor wafer. The smaller features, represent a microrough surface, with respect to the electroplating bath. On a macrorough surface the dimensions of the asperities and recesses, i.e., departures from the plane of the surface are similar in size to the thickness of the Nernst diffusion layer prevailing under conditions of the plating bath and plating current. On a microrough surface the dimensions of the asperities and recesses, i.e., departures from the plane of the surface are smaller than the thickness of the Nernst diffusion layer prevailing under the hydrodynamic conditions of the plating bath and plating current. The effect of the surface roughness on the distribution of metal deposited on the surface and the corresponding use of modulated electric fields, i.e., pulse reverse current, to produce a uniform filling of recesses in the surface is discussed in U.S. Pat. No. 6,319,384.

It has now been found that, when features of different sizes are present on the surface of a semiconductor, it is desirable to use a waveform appropriate for each specific size range in order to produce a uniform and complete filling of the recesses with metal.

The effective size of a recess may be characterized by its smallest transverse dimension, which determines how readily the inside of the recess is accessible to the ions of the metal in the plating bath. Thus a via having a diameter of a certain dimension, e.g., 1 micrometer, and a trench having a width of the same dimension will be expected to be filled satisfactorily by the same waveform or generally similar waveforms. Hence this characteristic length may be used to select an appropriate waveform.

In general, as discussed in U.S. Pat. No. 6,319,384, the waveform choosen to fill macroscopic recesses, i.e., those that represent a macroprofile, is a pulse waveform having relatively long cathodic pulses, i.e., pulses that deposit metal on the surface, and relatively short anodic pulses, i.e., pulses that remove metal from the surface. Furthermore, the waveform chosen to fill microscopic recesses, i.e., those that present a microprofile, is a pulse reverse waveform having relatively short cathodic pulses, i.e., pulses that deposit metal on the surface, and relatively long anodic pulses, i.e., pulses that remove metal from the surface. When semiconductor wafers are plated, they may be rotated more or less rapidly with respect to the plating bath. Such rotation provides a relative motion between the surface of the wafer and the bulk plating solution that affects the thickness of the Nernst diffusion layer. Typically, a more rapid rotation of the wafer produces a thinner diffusion layer. Accordingly, it is possible to adjust, within limits, the ratio of the size of the recesses to the thickness of the diffusion layer, and thereby to determine, at least for some size range of the recesses, whether a given recess presents a macroprofile or a microprofile. However, for the smallest recesses currently used in the manufacture of VLSI and ULSI chips, e.g., submicron dimensions ranging down to about 0.13 micrometers, the smallest recesses will under practical plating conditions of bath agitation and wafer rotation essentially always present a microprofile. Accordingly, the first step in the process of the invention will ordinarily be an electroplating step using a waveform appropriate for depositing metal uniformly in microprofile recesses.

The larger recesses in a semiconductor wafer may present either a microprofile or a macroprofile, depending on the ratio of the characteristic transverse dimension of the recess and the thickness of the Nernst diffusion layer under the conditions of bath agitation and wafer rotation rate used in the electroplating step. If the larger recesses present a microprofile, a microprofile waveform may be used. However, typically, a larger recess will require a pulse train having a longer period (lower frequency) than that used for plating the smaller recesses. Typical frequency ranges are from 10 to 12,000 Hz.

If the large recesses present a macroprofile uniform filling of the recesses is accomplished by using a different pulse waveform having relatively long cathodic pulses and relatively short anodic pulses. The use of different waveforms for sequential filling of recesses of different sizes in circuit board is disclosed and discussed in U.S. Pat. No. 6,309,528, the entire disclosure of which is incorporated herein by reference.

The method of the invention is schematically illustrated in the accompanying drawing. The drawing shows a substrate in cross section representing a semiconductor wafer, or the like, having features, e.g., vias, trenches, etc., having three different characteristic transverse dimensions. The final cross-section of the metal deposit after the etching step of the exemplary process is illustrated as a hatched section with a generally planar surface profile, indicated as profile IV. The profile of the metal deposit after each plating step of the process is indicated by the successive profiles, I, II and III.

In order to deposit metal onto the substrate it must be sufficiently electrically conductive to serve as the cathode of the electroplating cell. If the substrate is an electrically conductive material it may itself serve as the conductive cathode for the electrodeposition process. If the substrate is not electrically conducting, e.g., an insulating layer deposited on the surface of a semiconductor wafer, a very thin layer of a conductive material is deposited over the surface of the wafer to serve as a cathode. Such a conductive layer, as well as other sublayers deposited to prevent diffusion of metal and the like are very thin and are not shown in the schematic cross-section.

The substrate semiconductor wafer is immersed in a plating bath containing ions of a metal to be deposited thereon, e.g., copper ions. The plating bath may also contain conventional additives appropriate for each particular metal to be plated.

The method of the invention may be used with any metal that can be deposited by electroplating techniques. Thus copper, silver, gold, zinc, chromium, nickel, and alloys thereof such as bronze, brass, and the like, may be applied to semiconductor surfaces by the process of the invention.

The invention is particularly useful in filling trenches and vias in damascene-prepared surfaces generated in the manufacture of VLSI semiconductor devices and the like and in preparing planar layers of metal on large-diameter semiconductor wafers.

Plating baths for depositing copper generally contain copper ions derived from a soluble copper salt, e.g, copper sulfate, a so-called carrier material, e.g., a polyhydroxy compound such as polyethylene glycol, and a controlled amount of chloride ion. However, it is not excluded that a copper plating bath usable in the process of the invention may be devoid of a carrier and chloride ion, i.e., may consist of only an aqueous solution of a suitable copper salt, e.g., copper(II) sulfate, copper (II) chloride, copper(II) citrate, copper(II) cyanide, and the like. A copper plating bath may also contain other additives that have the function of improving the smoothness of the deposit and filling of recesses or provide a plated surface of superior brightness. These "levelers" and "brighteners" are present in very low concentration; consequently it is difficult to monitor and control the concentration for optimum effect. Although the process of the invention may be used with conventional copper plating baths incorporating levelers and brighteners, it is generally possible to achieve a satisfactory deposit of copper from a plating bath devoid of levelers and brighteners, i.e., containing only a carrier and chloride in addition to the copper salt. Suitable baths for use with the process of the invention are disclosed in U.S. Pat. No. 6,319,384.

A suitable anode, e.g., a copper anode for a copper plating bath, is immersed in the bath and an electric current is passed between the electrodes with the substrate being predominantly cathodic with respect to the anode.

In a first plating step of the process of the invention, step a metal, e.g., copper, is deposited into the smallest recesses using a waveform that is appropriate for filling recesses that present a microprofile. After an appropriate plating time, the cross section of the plated deposit may be expected to resemble that shown by profile I. The smallest recess is completely filled, the intermediate recess contains a substantial deposit of metal but may not be entirely filled, and the largest recess has received a generally conformal coating of metal.

The illustrated waveform is a pulse reverse waveform having a short cathodic on-time and a long anodic on-time. Therefore the cathodic duty cycle is less than about 50% and the anodic duty cycle is greater than about 50%. Metal is deposited during the cathodic pulse and dissolved from the surface during the anodic pulse. The peak currents of the cathodic and anodic pulses are adjusted to provide a cathodic/anodic charge transfer ratio that greater than one. Accordingly, the waveform produces a net deposit of metal, with the deposit directed preferentially to the recess, as discussed and explained in U.S. Pat. No. 6,319,384. According to the invention the on-time of the cathodic pulse may range from about 0.83 microseconds ($\mu$s) to about 50 milliseconds, preferably from about 1 ps to about 10 milliseconds, more preferably from about 1.7 $\mu$s to about 5 milliseconds, and still more preferably from about 2.5 $\mu$s to 1 millisecond. The anodic pulse is longer than the cathodic pulse and may range from about 42 $\mu$s to about 99 milliseconds, preferably from about 50 $\mu$s to about 19.8 milliseconds, more preferably from about 84 $\mu$s to about 9.9 milliseconds, and still more preferably from about 125 $\mu$s to about 1.98 milliseconds.

The cathodic duty cycle for plating a microprofile should be relatively short, less than about 50%, and the cathodic pulses should be relatively short to favor uniform deposition of metal on both the concave (trenches) and convex (peaks) portions of the substrate surface. Preferably, the cathodic duty cycle is from about 30% to about 1%, more preferably from about 30% to about 15% and still more preferably from about 30% to about 20%. Conversely, the anodic duty cycle should be relatively long, greater than about 50%, and the anodic pulses should be relatively long in order to favor removal of excess metal from the convex and peak portions of the substrate surface. Preferably, the anodic duty cycle is from about 60% to about 99%, more preferably from about 70% to about 85% and still more preferably from about 70% to about 80%. Because the anodic duty cycle is longer than the cathodic duty cycle, the peak anodic voltage (and corresponding current), will be less than the peak cathodic voltage (and corresponding current). Accordingly, the cathodic-to-anodic net charge ratio will be greater than one, in order to provide a net deposition of metal on the surface. Although the anodic removal of excess metal reduces the overall efficiency of the electroplating process, the benefits of filling the trenches in damascene-prepared surfaces and of avoiding excessive plating thickness at the edges of plated wafers more than compensate for any loss in electroplating efficiency.

The frequency of the pulse train for plating a microprofile may range from about 10 Hertz to about 12000 Hertz, preferably from about 50 Hz to about 12000 Hz and more preferably from about 500 Hz to about 10000 Hz and still more preferably from about 4000 Hz to about 10000 Hz. Accordingly, the cathodic and anodic pulse widths may vary from about 1.0 microsecond to about 100 milliseconds.

After the smallest recesses have been filled, the electrodeposition is continued in a second step in which larger recesses are filled. Depending on the size of the recesses and the agitation conditions of the plating bath, e.g., the rate of rotation of the wafer, these recesses may present either a microprofile or a macroprofile, i.e., the recesses may be hydrodynamically isolated or hydrodynamically accessible to the bulk plating solution. If the somewhat larger recesses present a microprofile, as illustrated in the center recess on the substrate in the drawing, the waveform is a "microprofile waveform" similar to that used in the first step. However, the cathodic and anodic pulses will be longer, producing a longer period of the pulse train and a lower frequency. These longer pulses produce a deposit having a cross-section profile such as that illustrated as profile II in the drawing. The deposit is directed preferentially to the intermediate size recess and fills it completely. Relatively little metal is deposited on the flat surface of the deposit from the previous step, and the large recess is partially, but not completely filled. For example, the pulse train used to fill the smaller recesses may have a period of about 1.0 microsecond to 100 milliseconds and more typically about 1.0 microsecond to 20 milliseconds whereas the pulse train used to fill the larger recesses may have a period of about 100 microseconds to 100 milliseconds and more typically about 300 microseconds to 20 milliseconds.

It is possible that both the small and large recesses on a given semiconductor wafer will present a microprofile for purposes of electrodeposition. In that case, the second deposition step, and additional deposition steps if features of several different sizes are present, will be accomplished using a microprofile type of waveform, i.e., a waveform having relatively short cathodic pulses, i.e., pulses that deposit metal on the surface, and relatively long anodic pulses, i.e., pulses that remove metal from the surface.

However, it is also possible that the semiconductor wafer may contain some relatively large features that may present a macroprofile under the conditions of bath agitation and/or wafer rotation rate. Such features are schematically represented by the right-hand recess on the substrate in the drawing. Recesses presenting a macroprofile are preferentially filled by using a pulse reverse waveform having relatively long cathodic pulses and relatively short anodic pulses, as shown in FIG. 1. Accordingly, the cathodic duty cycle of such a pulse train will ordinarily be longer than about 50% and the anodic duty cycle will be shorter than about 50%. Preferential filling of macroprofile recesses is discussed in U.S. Pat. No. 6,309,528. The metal deposit produced by a plating step using a macroprofile waveform is illustrated by profile III in the drawing. The metal deposit has completely filled the large recess and additional metal has been deposited on the surface of the wafer.

Although the use of modulated electric fields makes it possible to deposit metal preferentially into recesses in a substrate surface, some metal is nevertheless deposited on the surface, as indicated in the drawing. This surface plating, or overplate, provides a general electrical connection between all the metallic conductors in the vias, trenches, and the like. Consequently, this overplate has to be removed in order to isolate the plated conductors to perform their specific conductive function. Conventionally the overplate has been removed by chemical-mechanical polishing (CMP), as discussed in U.S. Pat. No. 6,319,384, which entails economic and environmental disadvantages. The CMP also prepares a smooth surface for subsequent deposition of another insulating or semiconductor layer if a multilayer structure is to be constructed. The amount of overplate that has to be removed by CMP can be significantly reduced by incorporating an electrical etching step into the process of the invention. Such an etching step is illustrated in the drawing, and a representative profile generated thereby is shown as profile IV. The drawing shows removal of most of the overplate by the etching step, leaving a much thinner layer of overplate to be removed by CMP.

The waveform used for etching may be any predominantly pulsed current anodic waveform, including direct current. For increased control of the planarity and smoothness of the etched surface, a macroprofile etching waveform or a microprofile etching waveform or a combination of etching waveforms may be used. Such etching waveforms and their use to control the removal of metal from a surface and the smoothness of an etched surface are discussed in U.S. patent application Ser. No. 09/080,264, and U.S. patent application Ser. No. 09/688,378, the entire disclosures of which are incorporated herein by reference. Thus, the duty cycle for the anodic on-time during the etching cycle may range from about 10% to 100% (i.e., direct current). Furthermore, etching may be carried out using a combination of different waveforms. For example it may be desirable to begin etching using a waveform for macrorough surfaces until large roughness is removed and convert to a waveform for microrough surfaces until the desired smoothness is achieved. It is usually more convenient to establish macroprofile conditions (a macroprofile regime) at the substrate surface by employing pulsed current using relatively short pulses. Typically the pulse width may range from about 0.1 microsecond to about 100 milliseconds, although shorter or longer pulses are not excluded, provided that macroprofile conditions are maintained at the substrate surface. It is preferred that the pulses be no longer than about 10 milliseconds, more preferably no longer than about 1 millisecond, and most preferably no longer than about 100 microseconds. The off-times and or reverse times between the pulses may range from about 10 microseconds to about 500 milliseconds. The duty cycle of the pulse train, i.e., the ratio of on-time to the period, may range from about 0.001 to about 0.5. Expressed in percentage, the duty cycle is preferably no greater than about 50%. More preferably it is no greater than about 25% or even 10%.

Once the macroasperities have been reduced in height to the point that they no longer of a size scale substantially equivalent to or exceeding the thickness of the Nernst diffusion layer, the etching is continued in a second step wherein the pulsed waveform conditions are adjusted to smooth the microasperities evident in the microprofile resulting from the reduction in height of the macroasperities. Additionally, the thickness of the Nernst diffusion layer may be adjusted to be greater than the height of the remaining asperities and thereby lead to a microprofile regime.

Therefore, in order to further smooth the microrough surface, the degree of agitation of the bath can be reduced, or the length of the pulses in the pulsed current can be lengthened and the off-time between the pulses reduced in order to produce a relatively thick Nernst diffusion layer. In fact, if there is no practical need for a reversing pulse, the process may be solely DC. The anodic or forward pulses in the second step of the process should be longer than those in the first step and in general will have a pulse duration or pulse width of at least 100 milliseconds, preferably at least 500 milliseconds. The current in the second step of the process may also be DC. The off-times and or reverse times will also in general be shorter than in the first step of the process. The duty cycle is preferably greater than about 50%. More preferably it is greater than about 75% or even 90%. The electropolishing in the second step of the process may continue until the surface is as smooth as desired for the particular application.

The invention is illustrated in more detail by the following non-limiting example.

EXAMPLE

An acid copper sulfate solution containing 60 g/L $CuSO_4$, 9% by volume of $H_2SO_4$, 60 ppm $Cl^-$, and 350 ppm PEG was used as the copper electroplating bath for all experiments. The plating bath temperature was 25° C. The plating experiments were conducted on 1.9×1.9 cm samples in a rotating electrode apparatus.

Figure 2:
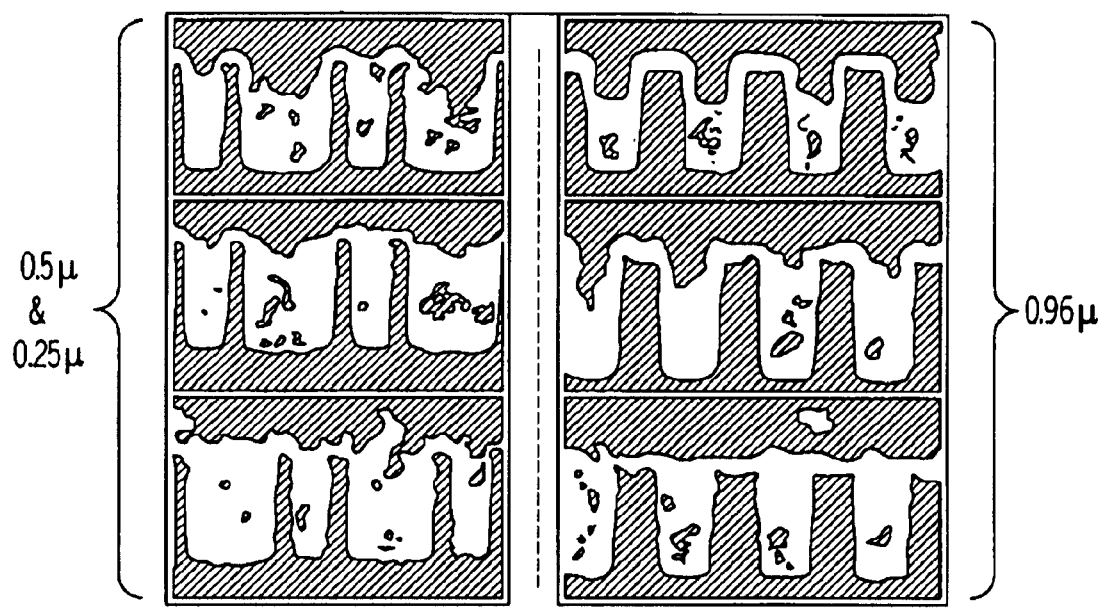
FIG. 2 is a composite of six photomicrographs of cross-sections of VLSI features in a silicon semiconductor substrate produced in the example.
Figure 3:
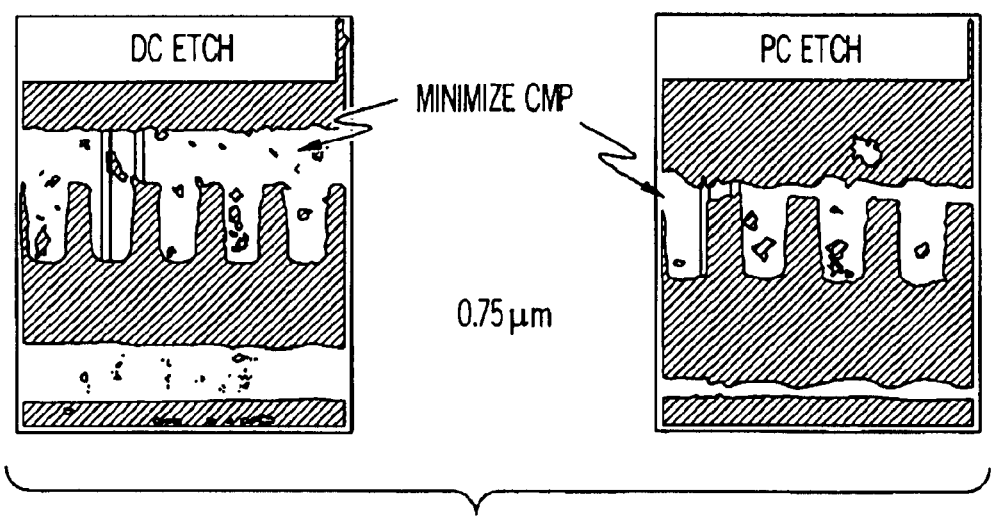
FIG. 3 is a composite of two photomicrographs of cross-sections of VLSI features in a silicon semiconductor substrate that compares the overplate using a DC etch versus a PC etch.

FIG. 2 shows metallization of VLSI features on IC's. Excellent, void-free filling for 0.25, 0.5, 0.75 and 1 $\mu$m IC features were obtained with minimal overplate, using a waveform sequence consisting of a short forward on-time/long reverse on-time, followed by a short reverse on-time etching step. The reduction in the amount of chemical mechanical planarization (CMP) required in subsequent processing. FIG. 3 shows the reduction in overplate due to the use of electrically mediated pulsed current (PC) etching, as compared to DC etching.

Having described the invention in detail and by reference to particular embodiments thereof, it will be apparent that modifications and variations are possible without departing from the spirit of the invention as defined by the following claims.

It is also possible, according to the invention, to interpose an etching step after one or more of the electrodeposition steps in order to prevent excessive buildup of overplated metal on the surface of the wafer.

What is claimed:

1. A method for filling recesses of different sizes on a semiconductor substrate comprising immersing a semiconductor substrate having a surface provided with recesses of different sizes in an electroplating bath containing ions of a metal to be deposited on said surface;

immersing a counter electrode in said plating bath;

passing an electric current between said substrate and said counterelectrode;

wherein, in a first electroplating step, said electric current is a modulated reversing electric current comprising a train of pulses that are cathodic with respect to said substrate and pulses that are anodic with respect to said substrate, whereby said pulse train in said first step has a first period, said cathodic pulses have an on-time of from about 0.83 microseconds to about 50 milliseconds and said anodic pulses have an on-time of from about 42 microseconds to about 99 milliseconds, said cathodic and anodic pulses have a charge transfer ratio of said cathodic pulses to said anodic pulses that is greater than one;

in a second electroplating step, said electric current is a, modulated reversing electric current comprising a train of pulses that are cathodic with respect to said substrate and pulses that are anodic with respect to said substrate, whereby said pulse train in said second step has a second period, said cathodic pulses have an on-time of from about 0.83 microseconds to about 50 milliseconds and said anodic pulses have an on-time of from about 42 microseconds to about 99 milliseconds, and said cathodic and anodic pulses have a charge transfer ratio of said cathodic pulses to said anodic pulses that is greater than one;

and said second period is greater than said first period.

2. The method of claim 1 wherein said metal is copper and said plating bath is devoid of levelers.

3. The method of claim 1 wherein said cathodic pulses have a duty cycle less than about 50% and said anodic pulses have a duty cycle of greater than about 50%.

4. The method of claim 3 wherein said metal is copper and said plating bath is devoid of levelers.

5. A method for filling recesses of different sizes on a semiconductor substrate comprising immersing a semiconductor substrate having a surface provided with at least one first recess having a first characteristic transverse dimension and at least one second recess having a second characteristic transverse dimension, said second characteristic transverse dimension being greater than said first characteristic transverse dimension, in an electroplating bath containing ions of a metal to be deposited on said surface;

immersing a counter electrode in said plating bath;

passing an electric current between said substrate and said counterelectrode;

wherein, in a first step, said first recess presents a microprofile with respect to said plating bath and said electric current is a modulated reversing electric current comprising a train of pulses that are cathodic with respect to said substrate and pulses that are anodic with respect to said substrate, said pulse train in said first step having a first period, said cathodic pulses have an on-time of from about 0.83 microseconds to about 50 milliseconds and said anodic pulses have an on-time of from about 42 microseconds to about 99 milliseconds, and said cathodic and anodic pulses have a charge transfer ratio of said cathodic pulses to said anodic pulses that is greater than one; and said electric current is maintained in said first step until said first recess is substantially filled with deposited metal;

in a second step, said second recess presents a microprofile with respect to said plating bath and said electric current is a modulated reversing electric current comprising a train of pulses that are cathodic with respect to said substrate and pulses that are anodic with respect to said substrate, said pulse train in said second step having a second period, said cathodic pulses have an on-time of from about 0.83 microseconds to about 50 milliseconds and said anodic pulses have an on-time of from about 42 microseconds to about 99 milliseconds; and said cathodic and anodic pulses have a charge transfer ratio of said cathodic pulses to said anodic pulses that is greater than one; and said electric current is maintained in said second step until said second is substantially filled with deposited metal, and said second period is greater than said first period.

6. The method of claim 5 wherein in at least one of the first and second step, said cathodic pulses have a duty cycle less than about 50% and said anodic pulses have a duty cycle of greater than about 50%.

7. The method of claim 6 wherein an electrochemical etching step is interposed between said first step and said second step.

8. The method of claim 6, additionally comprising an electrochemical etching step following said second step.

9. The method of claim 8 wherein the electrochemical etching step is conducted using a waveform for macrorough surfaces followed by a waveform for microrough surfaces.

10. The method of claim 6 wherein said metal is copper and said plating bath is devoid of brighteners.

11. The method of claim 5 wherein said metal is copper and said plating bath is devoid of brighteners.

12. A method for filling recesses of different sizes on a semiconductor substrate comprising immersing a semiconductor substrate having a surface provided with at least one first recess having a first characteristic transverse dimension and at least one second recess having a second characteristic transverse dimension, said second characteristic transverse dimension being greater than said first characteristic transverse dimension, in an electroplating bath containing ions of a metal to be deposited on said surface;

immersing a counter electrode in said plating bath;

passing an electric current between said substrate and said counterelectrode;

wherein, in a first step, said first recess presents a microprofile with respect to said plating bath and said electric current is a modulated reversing electric current comprising a train of pulses that are cathodic with respect to said substrate and pulses that are anodic with respect to said substrate, said pulse train in said first step having a first period, said cathodic pulses have an on-time of from about 0.83 microseconds to about 50 milliseconds and said anodic pulses have an on-time of from about 42 microseconds to about 99 milliseconds, and said cathodic and anodic pulses have a charge transfer ratio of said cathodic pulses to said anodic pulses that is greater than one; and said electric current is maintained in said first step until said first recess is substantially filled with deposited metal;

in a second step, said second recess presents a macroprofile with respect to said plating bath and said electric current is a modulated reversing electric current comprising a train of pulses that are cathodic with respect to said substrate and pulses that are anodic with respect to said substrate, said pulse train in said second step having a second period, said anodic pulses have an on-time of from about 42 microseconds to about 99 milliseconds and said cathodic pulses have an on-time of from about 0.83 microseconds to about 50 milliseconds, and said cathodic and anodic pulses have a charge transfer ratio of said cathodic pulses to said anodic pulses that is greater than one; and said electric current is maintained in said second step until said second is substantially filled with deposited metal.

13. The method of claim 12 wherein in at least one of the first and second steps, said cathodic pulses have a duty cycle less than about 50% and said anodic pulses have a duty cycle of greater than about 50%.

14. The method of claim 13, additionally comprising an electrochemical etching step following said second step.

15. The method of claim 14 wherein the electrochemical etching step is conducted using a waveform for macrorough surfaces followed by a waveform for microrough surfaces.

16. The method of claim 13 wherein an electrochemical etching step is interposed between said first step and said second step.

17. The method of claim 13 wherein said metal is copper and said plating bath is devoid of levelers and brighteners.

18. The method of claim 12 wherein said metal is copper and said plating bath is devoid of levelers and brighteners.

* * * * *